United States Patent
Jeong (10) Patent No.: US 9,552,894 B2
(45) Date of Patent: Jan. 24, 2017

(54) IMPEDANCE CALIBRATION CIRCUIT, AND SEMICONDUCTOR MEMORY AND MEMORY SYSTEM USING THE SAME

(71) Applicant: SK hynix Inc., Icheon-si, Gyeonggi-do (KR)

(72) Inventor: Chun Seok Jeong, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 14/564,404

(22) Filed: Dec. 9, 2014

(65) Prior Publication Data

US 2016/0071616 A1  Mar. 10, 2016

(30) Foreign Application Priority Data

Sep. 5, 2014 (KR) .......................... 10-2014-0118858

(51) Int. Cl.
| | |
|---|---|
| *H01L 23/58* | (2006.01) |
| *G11C 29/02* | (2006.01) |
| *G11C 29/50* | (2006.01) |
| *G11C 29/44* | (2006.01) |

(52) U.S. Cl.
CPC ........... *G11C 29/025* (2013.01); *G11C 29/028* (2013.01); *G11C 29/50008* (2013.01); *G11C 2029/4402* (2013.01)

(58) Field of Classification Search
CPC ... G11C 29/1201; G11C 29/027; G11C 29/54; G11C 29/74
See application file for complete search history.

(56) References Cited

U.S. PATENT DOCUMENTS

| | | | | |
|---|---|---|---|---|
| 6,756,858 | B2 * | 6/2004 | Gonzalez | H03H 11/30 326/30 |
| 8,040,164 | B2 * | 10/2011 | Parameswaran | H04L 25/0278 326/30 |
| 2006/0097749 | A1 * | 5/2006 | Ahmad | H03K 19/0005 326/30 |
| 2008/0211534 | A1 * | 9/2008 | Jeong | G11C 5/063 326/30 |
| 2009/0085614 | A1 * | 4/2009 | Parameswaran | H04L 25/0278 327/108 |
| 2009/0259425 | A1 * | 10/2009 | Ku | H03K 19/0005 702/104 |
| 2011/0184688 | A1 * | 7/2011 | Uetake | G11C 29/40 702/120 |
| 2011/0185688 | A1 * | 8/2011 | Macguinness | A01K 13/008 54/66 |
| 2014/0063887 | A1 * | 3/2014 | Vogelsang | H01L 25/0657 365/51 |
| 2015/0115999 | A1 * | 4/2015 | Lee | H03K 19/01754 326/30 |

FOREIGN PATENT DOCUMENTS

KR  1020130070250 A  6/2013
KR  1020140007331 A  1/2014

* cited by examiner

*Primary Examiner* — Shaun Campbell
(74) *Attorney, Agent, or Firm* — William Park & Associates Ltd.

(57) ABSTRACT

An embodiment may include a first replica driver group configured for replicating an output driver of a physical area. A second replica driver group configured for replicating an output driver of a test electrode area for direct access of a memory, and an impedance calibration unit configured to independently perform an impedance matching operation of the first replica driver group and the second replica driver group.

20 Claims, 6 Drawing Sheets

IMPEDANCE CALIBRATION CIRCUIT, AND SEMICONDUCTOR MEMORY AND MEMORY SYSTEM USING THE SAME

CROSS-REFERENCES TO RELATED APPLICATION

The present application claims priority under 35 U.S.C. §119(a) to Korean application number 10-2014-0118858, filed on Sep. 5, 2014, in the Korean Intellectual Property Office, which is incorporated herein by reference in its entirety as set forth in full.

BACKGROUND

1. Technical Field

Various embodiments generally relate to a semiconductor circuit, and more particularly, to an impedance calibration circuit, and a semiconductor memory and a memory system using the same.

2. Related Art

As an operation speed of a semiconductor memory (hereinafter, referred to as a memory) increases, developments have been made for a SIP (System In Package) having a memory controller, such as a CPU or a GPU, and a memory integrated together into a single package.

An increase in an I/O (an input/output circuit) speed of a memory is limited.

SUMMARY

According to an embodiment, an impedance calibration circuit may include a first replica driver group configured for replicating an output driver of a physical area, and a second replica driver group configured for replicating an output driver of a test electrode area for direct access of a memory. The impedance calibration circuit may include an impedance calibration unit configured to independently perform an impedance matching operation of the first replica driver group and the second replica driver group.

According to an embodiment, a semiconductor memory may include a plurality of stacked dies, wherein one die of the plurality of stacked dies may include a physical area and a test electrode area for direct access to an exterior, and may be configured to match impedance of an output driver of the physical area and impedance of an output driver of the test electrode area with preset impedance.

According to an embodiment, a memory system may include a memory controller and a plurality of semiconductor memories connected to the memory controller through an interposer. Each of the plurality of semiconductor memories may include a test electrode area for direct access to an exterior and a physical area, and may be configured to match impedance of an output driver of the physical area and impedance of an output driver of the test electrode area with preset impedance. The test electrode areas of the plurality of semiconductor memories may be configured to share a signal line for signal input/output to an exterior of the memory system.

DETAILED DESCRIPTION

Hereinafter, an impedance calibration circuit, and a semiconductor memory and a memory system using the same according to various embodiments will be described in detail with reference to the accompanying drawings through examples of the embodiments.

Since an increase in an I/O (an input/output circuit) speed of a memory is limited, a method for increasing a bandwidth by increasing the number of I/Os may be used.

An impedance calibration circuit capable of perhaps substantially preventing impedance mismatch is described herein.

A semiconductor memory and a memory system capable of allowing a plurality of memories to share a direct access ball (DAB) by substantially preventing impedance mismatch may be described herein.

Figure 1:
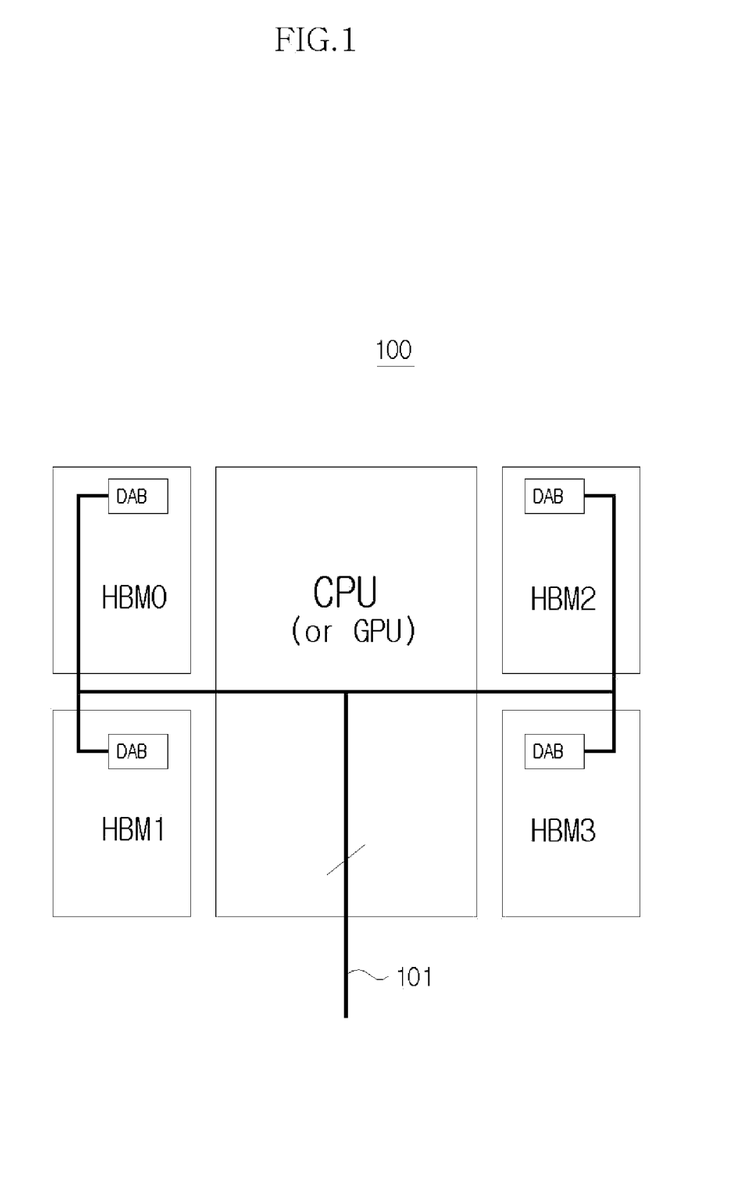
FIG. 1 is a plan view of a representation of a memory system 100 according to an embodiment.

Referring to FIG. 1, a memory system 100 according to an embodiment may have a SIP (System In Package) structure.

The memory system 100 may include a plurality of memories HBM0 to HBM3 and a memory controller CPU or GPU (i.e., central processing unit or graphics processing unit).

Each of the plurality of memories HBM0 to HBM3 may have a HBM (High Bandwidth Memory) structure. The HBM may include a plurality of dies that are stacked and that are electrically connected to one another via through electrodes to increase the number of input/output units. This structure may result in an increase in the bandwidth.

Each of the plurality of memories HBM0 to HBM3 may include a direct access ball (DAB). With the DAB an exterior device may directly access the plurality of memories HBM0 to HBM3. The memories HBM0 to HBM3 may be accessed through the DAB for the purposes of for example testing each of the plurality of memories HBM0 to HBM3.

The direct access ball (DAB) of each of the plurality of memories HBM0 to HBM3 may be configured to share a signal line 101 for signal input/output to an exterior of the memory system 100, that is, a package.

Figure 2:
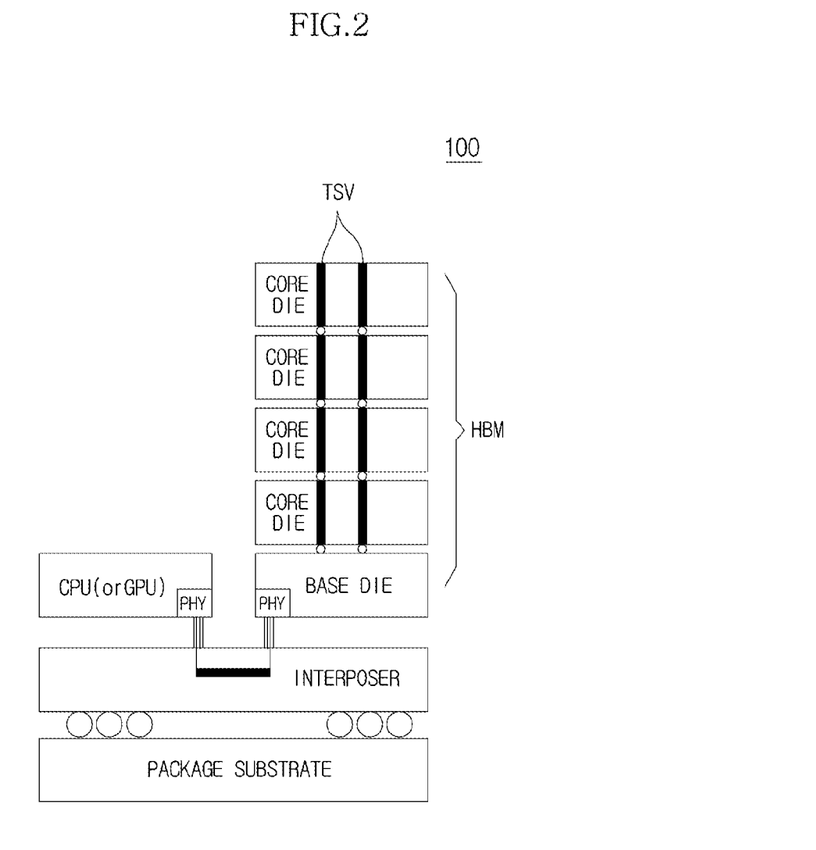
FIG. 2 is a sectional view of a representation of a memory system 100.

Referring to FIG. 2, the memory system 100 may include a memory HBM, a memory controller CPU or GPU, and an interposer. The memory system 100 may include a package substrate.

The interposer may be connected to an upper portion of the package substrate.

The memory HBM and the memory controller CPU or GPU may be connected to an upper portion of the interposer.

The memory HBM and the memory controller CPU or GPU may be connected to respective physical areas PHY through the interposer.

The memory HBM may have a structure in which a plurality of dies are stacked.

The plurality of dies may include a base die and a plurality of core dies.

The base die and the plurality of core dies may be electrically connected to each other via through electrodes (for example, through-silicon vias (TSVs)).

FIG. 2 is a sectional view representation of the memory system 100 and illustrates the memory HBM as one of the plurality of memories HBM0 to HBM3 of FIG. 1.

Figure 3:
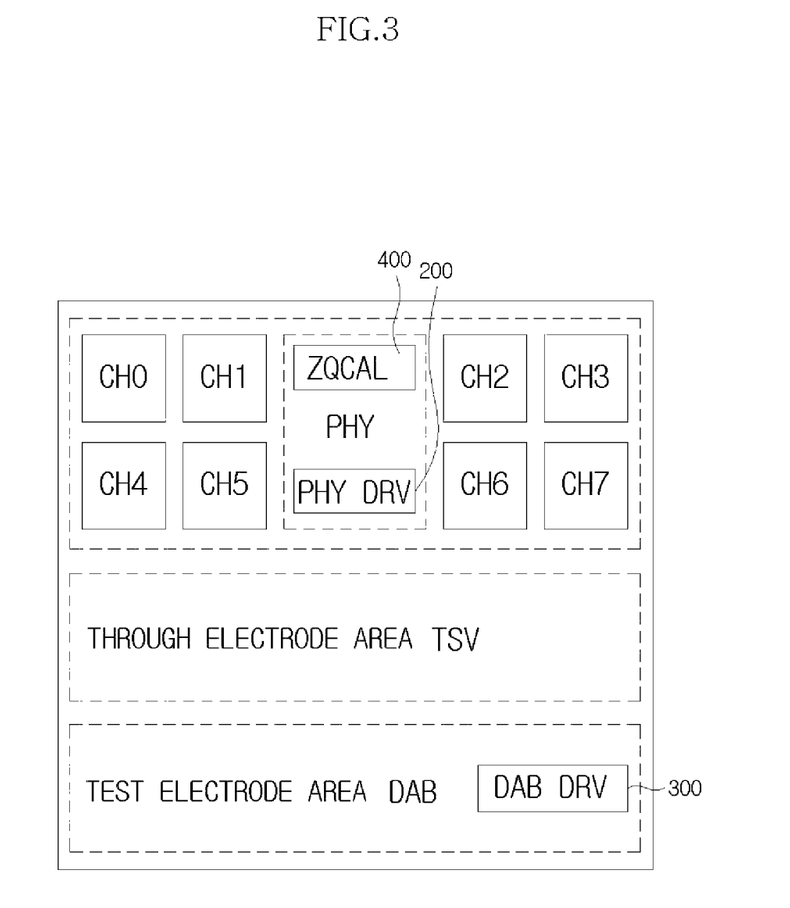
FIG. 3 is a plan view of a representation of a base die of FIG. 2.

Referring to FIG. 3, the base die of FIG. 2 may include channel areas CH0 to CH7, a physical area PHY, a through electrode area, and a test electrode area.

The channel areas CH0 to CH7 are areas for an interface with memory channels including a plurality of core dies.

The physical area PHY is an area including an input/output-related circuit for an interface with the memory controller CPU or GPU of FIG. 2.

The physical area PHY may further include an output driver (PHY DRV) 200 and an impedance calibration circuit (ZQCAL) 400.

The through electrode area may include a plurality of through electrodes (TSVs).

The test electrode area may include a plurality of direct access balls (DAB) by which an exterior, that is, the memory controller directly accesses and tests the memory HBM without the interposer, and an output driver (DAB DRV) 300.

Figure 4:
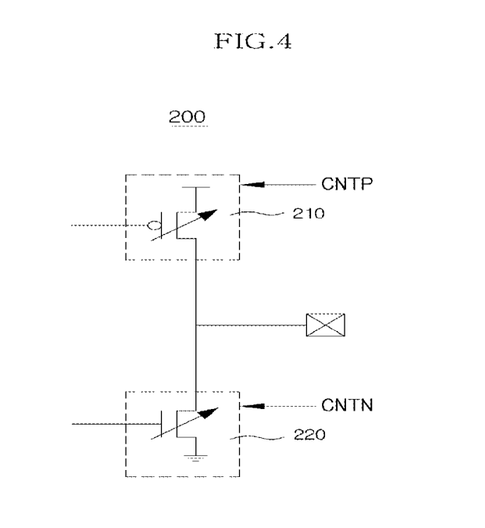
FIG. 4 is a circuit diagram of a representation of a physical area output driver (PHY DRV) 200 of FIG. 3.

Referring to FIG. 4, the output driver 200 of the physical area PHY may include a pull-up driver 210 and a pull-down driver 220.

A resistance value of the pull-up driver 210 may be calibrated by a first impedance calibration code CNTP.

A resistance value of the pull-down driver 220 may be calibrated by a second impedance calibration code CNTN.

The output driver 200 may not have an output terminal to the exterior of the memory HBM. No resistors may exist in the pull-up driver 210 and the pull-down driver 220.

Figure 5:
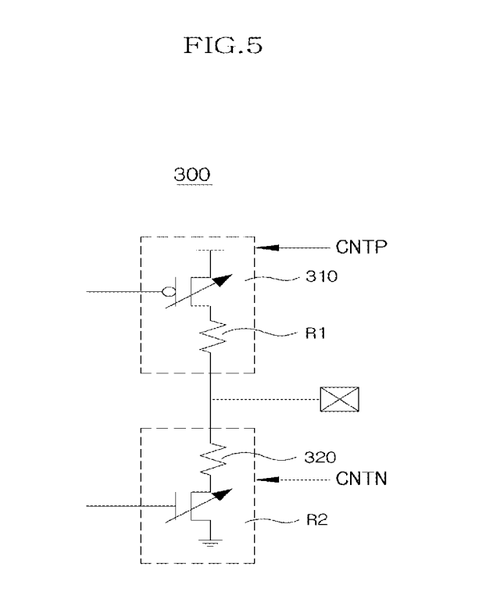
FIG. 5 is a circuit diagram of a representation of a DAB area output driver (DAB DRV) 300 of FIG. 3.

Referring to FIG. 5, the output driver 300 of the test electrode area may include a pull-up driver 310 and a pull-down driver 320.

A resistance value of the pull-up driver 310 may be calibrated by the first impedance calibration code CNTP.

A resistance value of the pull-down driver 320 may be calibrated by the second impedance calibration code CNTN.

The output driver 300 may coupled to a direct access ball (DAB) is formed at the exterior of the memory HBM, and passive resistors R1 and R2 may be connected to the pull-up driver 310 and the pull-down driver 320 for noise prevention, respectively.

Due to the structural difference between the output driver 200 of the physical area PHY and the output driver 300 of the test electrode area, when impedance calibration information used for impedance matching of the output driver 200 of the physical area PHY is used for the output driver 300 of the test electrode area, impedance mismatch may occur between the output drivers 200 and 300.

The memory system 100 according to an embodiment employs the impedance calibration circuit 400 that independently performs an impedance matching operation of the output driver 200 of the physical area PHY and the output driver 300 of the test electrode area, thereby substantially preventing the impedance mismatch between the output drivers 200 and 300.

Figure 6:
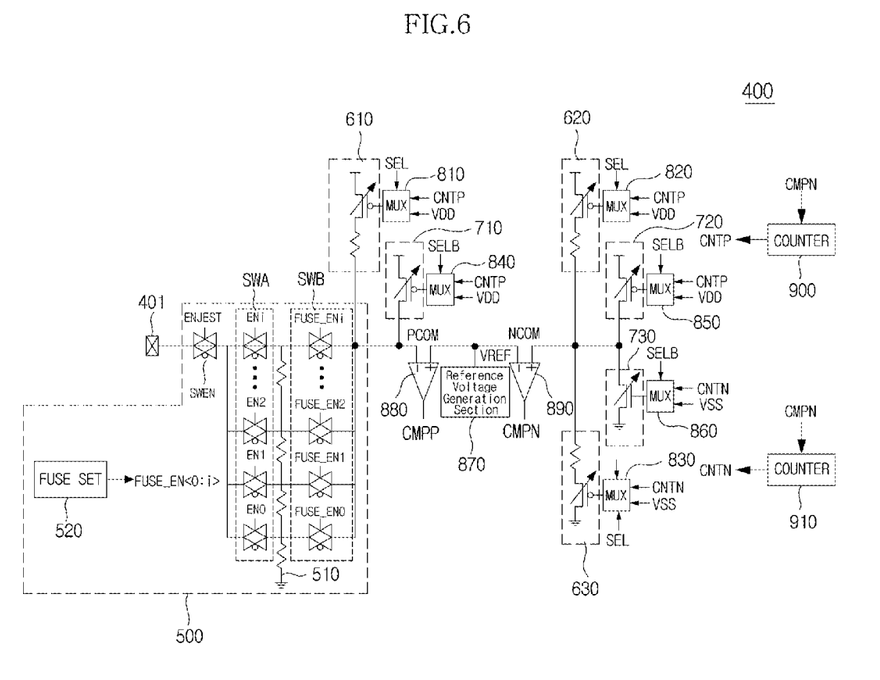
FIG. 6 is a circuit diagram of a representation of an impedance calibration circuit (ZQCAL) 400 of FIG. 3.

Referring to FIG. 6, the impedance calibration circuit 400 may include a test pad 401, and a reference resistance setting unit 500. The impedance calibration circuit 400 may include a first replica driver group, a second replica driver group, and an impedance calibration unit.

The first replica driver group may include pull-up drivers 610 and 620 obtained by replicating the pull-up driver 310 of the test electrode area of FIG. 5. The first replica driver group may include a pull-down driver 630 obtained by replicating the pull-down driver 320 of the test electrode area of FIG. 5.

The second replica driver group may include pull-up drivers 710 and 720 obtained by replicating the pull-up driver 210 of the physical area of FIG. 4. The second replica driver group may include a pull-down driver 730 obtained by replicating the pull-down driver 220 of the physical area of FIG. 4.

The reference resistance setting unit 500 may be configured such that a reference resistance value is set in a test mode.

The reference resistance setting unit 500 may include a resistor array 510, a plurality of switches SWEN, SWA, and SWB, and a fuse set 520.

The resistor array 510 may include a plurality of resistors serially connected to one another.

The fuse set 520 may be configured to output stored fuse signals FUSE_EN<0:i>.

The test activation switch SWEN may be configured to connect the test pad 401 to the first switch array SWA in response to a test enable signal ENTEST.

The first switch array SWA may be configured to connect the test pad 401 to a specific node of the nodes of the resistor array 510 in response to an enable signal EN<0:i>.

The second switch array SWB may be configured to connect a specific node of the nodes of the resistor array 510 to the pull-up driver 610 or the pull-up driver 710 in response to the fuse signals FUSE_EN<0:i>.

The memory HBM may not to be connected an external resistor by the HBM specification.

Accordingly, in a test operation, the memory HBM allows a constant current to flow by using the test pad 401, and allows a resistance value of the reference resistance setting unit 500 to be substantially equal to the reference resistance value by using the enable signal EN<0:i>.

The memory HBM controls the fuse set 520 to output a value of the fuse signals FUSE_EN<0:i> substantially equal to a value of the enable signal EN<0:i> in the state in which the resistance value of the reference resistance setting unit 500 is substantially equal to the reference resistance value.

After the test operation, the resistance value of the reference resistance setting unit 500 may be set as the reference resistance value by the fuse signals FUSE_EN<0:i>.

The impedance calibration unit may be configured to calibrate impedance calibration information, that is, the first impedance calibration code CNTP and the second impedance calibration code CNTN, such that an output voltage PCOM or NCOM of a driver group selected from the first replica driver group 610, 620, and 630 and the second replica driver group 710, 720, and 730 is substantially equal to a reference voltage VREF.

The impedance calibration unit may include multiplexing sections 810, 820, 830, 840, 850, and 860, a reference voltage generation section 870, comparison sections 880 and 890, and counting sections 900 and 910.

The first to third multiplexers 810, 820, and 830 may be configured to activate the first replica driver group 610, 620, and 630 when a selection signal SEL is at a specific logic level (for example, a logic high level), and to calibrate a resistance value of the first replica driver group 610, 620, and 630 by using the first impedance calibration code CNTP and the second impedance calibration code CNTN.

The first to third multiplexers 810, 820, and 830 may be configured, for example, to deactivate the first replica driver group 610, 620, and 630 when the selection signal SEL is at a logic low level.

The fourth to sixth multiplexers 840, 850, and 860 may be configured, for example, to activate the second replica driver group 710, 720, and 730 when a selection signal SELB is at a logic high level, and to calibrate a resistance value of the second replica driver group 710, 720, and 730 by using the first impedance calibration code CNTP and the second impedance calibration code CNTN.

The fourth to sixth multiplexers 840, 850, and 860 may be configured to, for example, deactivate the second replica driver group 710, 720, and 730 when the selection signal SELB is at a logic low level.

The first multiplexer 810 may apply the first impedance calibration code CNTP or a power level VDD to the pull-up driver 610 according to the selection signal SEL.

The second multiplexer 820 may apply the first impedance calibration code CNTP or the power level VDD to the pull-up driver 620 according to the selection signal SEL.

The third multiplexer 830 may apply the second impedance calibration code CNTN or a ground level VSS to the pull-down driver 630 according to the selection signal SEL.

The fourth multiplexer 840 may apply the first impedance calibration code CNTP or the power level VDD to the pull-up driver 710 according to the selection signal SELB.

The fifth multiplexer 850 may apply the first impedance calibration code CNTP or the power level VDD to the pull-up driver 720 according to the selection signal SELB.

The sixth multiplexer 860 may apply the second impedance calibration code CNTN or the ground level VSS to the pull-down driver 730 according to the selection signal SELB.

The reference voltage generation section 870 may be configured to generate the reference voltage VREF corresponding to 0.5*VDD.

The first comparison section 880 may be configured to compare the reference voltage VREF with the first voltage PCOM and to generate a first comparison signal CMPP.

The second comparison section 890 may be configured to compare the reference voltage VREF with the second voltage NCOM and to generate a second comparison signal CMPN.

The first counting section 900 may be configured to count a value of the first impedance calibration code CNTP in response to the first comparison signal CMPP.

The second counting section 910 may be configured to count a value of the second impedance calibration code CNTN in response to the second comparison signal CMPN.

An example of the impedance calibration operation of the aforementioned impedance calibration circuit 400 may be described as follows.

A selection signal SEL at a logic high level is provided from an exterior of the memory system 100, thereby activating the first replica driver group 610, 620, and 630.

Since the selection signal SEL is at the logic high level, the selection signal SELB is at a logic low level, so that the second replica driver group 710, 720, and 730 is deactivated, that is, an electrical connection with the second replica driver group 710, 720, and 730 is blocked.

For the purpose of convenience, the example in which the first replica driver group 610, 620, and 630 is first selected has been described. Accordingly, the second replica driver group 710, 720, and 730 may also be first selected.

A resistance value of the pull-up driver 610 of the first replica driver group 610, 620, and 630 is set according to an initial value of the first impedance calibration code CNTP.

The value of the first impedance calibration code CNTP is changed until the first voltage PCOM outputted from a connection node of the pull-up driver 610 and the reference resistance setting unit 500 is substantially equal to the reference voltage VREF.

Since the reference voltage VREF is 0.5*VDD, when the first voltage PCOM is substantially equal to the reference voltage VREF, the pull-up driver 610 has substantially the same resistance value as that of the reference resistance setting unit 500.

The pull-up driver 620 also has substantially the same resistance value as that of the pull-up driver 610 according to the first impedance calibration code CNTP.

A resistance value of the pull-down driver 630 is set according to an initial value of the second impedance calibration code CNTN.

The value of the second impedance calibration code CNTN is changed until the second voltage NCOM outputted from a connection node of the pull-up driver 620 and the pull-down driver 630 is substantially equal to the reference voltage VREF.

Since the reference voltage VREF is 0.5*VDD, when the second voltage NCOM is substantially equal to the reference voltage VREF, the pull-down driver 630 has substantially the same resistance value as that of the pull-up driver 620.

Through the aforementioned processes, the resistance value calibration of the first replica driver group 610, 620, and 630, that is, the resistance value calibration operation of the pull-up driver 310 of the test electrode area is completed.

A selection signal SELB at a logic high level is provided from the exterior of the memory system 100, thereby activating the second replica driver group 710, 720, and 730.

Since the selection signal SELB is at the logic high level, the selection signal SEL is at a logic low level, so that the first replica driver group 610, 620, and 630 is deactivated, that is, an electrical connection with the first replica driver group 610, 620, and 630 is blocked.

A resistance value of the pull-up driver 710 of the second replica driver group 710, 720, and 730 is set according to the initial value of the first impedance calibration code CNTP.

The value of the first impedance calibration code CNTP is changed until the first voltage PCOM outputted from a connection node of the pull-up driver 710 and the reference resistance setting unit 500 is substantially equal to the reference voltage VREF.

Since the reference voltage VREF is 0.5*VDD, when the first voltage PCOM is substantially equal to the reference voltage VREF, the pull-up driver 710 has substantially the same resistance value as that of the reference resistance setting unit 500.

The pull-up driver 720 also has substantially the same resistance value as that of the pull-up driver 710 according to the first impedance calibration code CNTP.

A resistance value of the pull-down driver 730 is set according to the initial value of the second impedance calibration code CNTN.

The value of the second impedance calibration code CNTN is changed until the second voltage NCOM outputted from a connection node of the pull-up driver 720 and the pull-down driver 730 is substantially equal to the reference voltage VREF.

Since the reference voltage VREF is 0.5*VDD, when the second voltage NCOM is substantially equal to the reference voltage VREF, the pull-down driver 730 has substantially the same resistance value as that of the pull-up driver 720.

Through the aforementioned processes, the resistance value calibration of the second replica driver group 710, 720, and 730, that is, the resistance value calibration operation of the pull-up driver 210 of the physical area is completed.

The impedance matching operation of the output driver 200 of the physical area PHY and the output driver 300 of the test electrode area is independently performed through the aforementioned impedance calibration circuit 400, so that impedance mismatch between the output drivers 200 and 300 can be substantially prevented.

The impedance mismatch between the output drivers 200 and 300 is substantially prevented, so that the direct access balls DAB of the plurality of memories HBM0 to HBM3 of the memory system 100 can share the signal line 101 for signal input/output to the exterior of the package.

The impedance calibration circuits, semiconductor memories, and/or memory systems discussed above (see FIGS. 1-6) are particular useful in the design of memory devices, processors, and computer systems. For example, referring to FIG. 7, a block diagram of a system employing the impedance calibration circuits, semiconductor memories, and/or memory systems in accordance with the embodiments are illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

Figure 7:
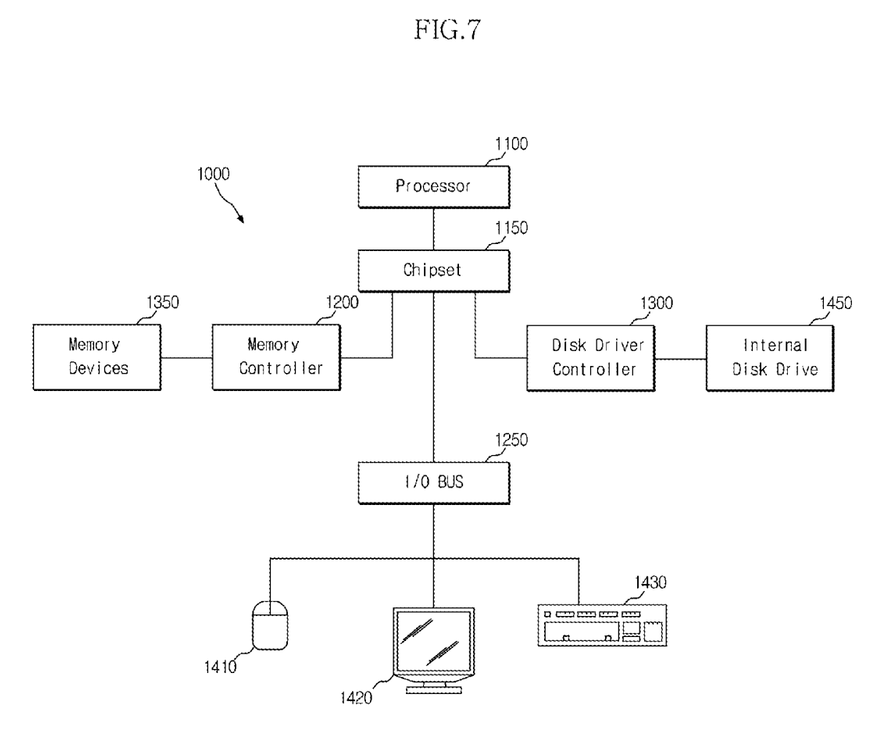
FIG. 7 illustrates a block diagram of an example of a representation of a system employing the impedance calibration circuit, semiconductor memory, and/or memory system in accordance with the embodiments discussed above with relation to FIGS. 1-6.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one impedance calibration circuit, semiconductor memory, and/or memory system as discussed above with reference to FIGS. 1-6. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one impedance calibration circuit, semiconductor memory, and/or memory system as discussed above with relation to FIGS. 1-6, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 7 is merely one example of a system employing the impedance calibration circuits, semiconductor memories, and/or memory systems as discussed above with relation to FIGS. 1-6. In alternate embodiments, such as cellular phones or digital cameras, the components may differ from the embodiments illustrated in FIG. 7.

While certain embodiments have been described above, it will be understood to those skilled in the art that the embodiments described are by way of example only. Accordingly, the impedance calibration circuit, the semiconductor memory, the memory system, and system using the same described herein should not be limited based on the described embodiments. Rather, the impedance calibration circuit, the semiconductor memory, the memory system, and the system using the same described herein should only be limited in light of the claims that follow when taken in conjunction with the above description and accompanying drawings.

What is claimed is:

1. An impedance calibration circuit comprising:
    a first replica driver group configured for replicating an output driver of a test electrode area for accessing a memory directly;
    a second replica driver group configured for replicating an output driver of a physical area; and
    an impedance calibration unit configured to perform an impedance matching operation for the test electrode area by activating only the first replica driver group, and perform an impedance matching operation for the physical area by activating only the second replica driver group,
    wherein the impedance calibration unit is configured to selectively supply a power voltage to only the first replica driver, and selectively supply the power voltage to only the second replica driver.

2. The impedance calibration circuit according to claim 1, wherein drivers of the second replica driver group are configured to prevent noise by having connections with resistors.

3. The impedance calibration circuit according to claim 1, further comprising:
    a reference resistance setting unit configured to set a reference resistance value through a test mode.

4. The impedance calibration circuit according to claim 3, wherein the reference resistance setting unit comprises:
    a resistor array;

a fuse set configured to output a fuse signal;
a first switch array configured to connect a test pad to one of nodes of the resistor array in response to an enable signal; and
a second switch array configured to connect one of the nodes of the resistor array to the first replica driver group in response to the fuse signal.

5. The impedance calibration circuit according to claim 1, wherein the impedance calibration unit is configured to calibrate a value of impedance calibration information such that an output voltage of a driver group selected from the first replica driver group and the second replica driver group is substantially equal to a reference voltage.

6. The impedance calibration circuit according to claim 1, wherein the impedance calibration unit comprises:
a multiplexing section configured to activate only one group from both the first replica driver group and the second replica driver group in response to a selection signal, and to calibrate a resistance value of the one group by using impedance calibration information;
a comparison section configured to compare a reference voltage with an output voltage of the one group and to generate a comparison signal; and
a counting section configured to count the impedance calibration information in response to the comparison signal.

7. The impedance calibration circuit according to claim 6, wherein the multiplexing section is configured to deactivate another one group of the first replica driver group and the second replica driver group in response to the selection signal.

8. A semiconductor memory comprising:
a plurality of stacked dies,
wherein one die of the plurality of stacked dies includes a physical area and a test electrode area for accessing the one die directly from an exterior of the one die, and is configured to match impedance of an output driver of the physical area and impedance of an output driver of the test electrode area with preset impedance without interacting with a central processing unit (CPU).

9. The semiconductor memory according to claim 8, wherein the one die comprises:
a physical area including an output driver and an impedance calibration circuit; and
a test electrode area including a plurality of direct access balls configured for directly accessing and testing the semiconductor memory, and an output driver.

10. The semiconductor memory according to claim 8, wherein the one die comprises:
a first replica driver group configured for replicating an output driver of the test electrode area;
a second replica driver group configured for replicating an output driver of the physical area; and
an impedance calibration unit configured to perform an impedance matching operation for the test electrode area by activating only the first replica driver group, and perform an impedance matching operation for the physical area by activating only the second replica driver group.

11. The semiconductor memory according to claim 10, wherein drivers of the second replica driver group are configured to prevent noise by having connections with resistors.

12. The semiconductor memory according to claim 10, further comprising:
a reference resistance setting unit configured to set a reference resistance value through a test mode.

13. The semiconductor memory according to claim 10, wherein the impedance calibration unit comprises:
a multiplexing section configured to activate only one group from both the first replica driver group and the second replica driver group in response to a selection signal, and to calibrate a resistance value of the one group by using impedance calibration information;
a comparison section configured to compare a reference voltage with an output voltage of the one group and to generate a comparison signal; and
a counting section configured to count the impedance calibration information in response to the comparison signal.

14. A memory system comprising:
a memory controller; and
a plurality of semiconductor memories connected to the memory controller through an interposer,
wherein each of the plurality of semiconductor memories includes a test electrode area for accessing the each of the plurality of semiconductor memories directly from an exterior of the each of the plurality of semiconductor memories and a physical area, and are configured to match impedance of an output driver of the physical area and impedance of an output driver of the test electrode area with preset impedance without interacting with a central processing unit (CPU), and
the test electrode areas of the plurality of semiconductor memories are configured to share a signal line for signal input/output to an exterior of the memory system.

15. The memory system according to claim 14, wherein the semiconductor memory comprises:
a plurality of stacked dies,
wherein one die of the plurality of stacked dies is configured to match the impedance of the output driver of the physical area and the impedance of the output driver of the test electrode area with the preset impedance.

16. The memory system according to claim 15, wherein the physical area of the one die further includes an impedance calibration circuit.

17. The memory system according to claim 14, wherein the semiconductor memory comprises:
a first replica driver group configured for replicating an output driver of the test electrode area;
a second replica driver group configured for replicating an output driver of the physical area; and
an impedance calibration unit configured to perform an impedance matching operation for the test electrode area by activating only the first replica driver group, and perform an impedance matching operation for the physical area by activating only the second replica driver group.

18. The memory system according to claim 17, wherein drivers of the second replica driver group are configured to prevent noise by having connections with resistors.

19. The memory system according to claim 17, further comprising:
a reference resistance setting unit configured to set a reference resistance value through a test mode.

20. The memory system according to claim 17, wherein the impedance calibration unit comprises:
a multiplexing section configured to activate only one group from both the first replica driver group and the second replica driver group in response to a selection signal, and to calibrate a resistance value of the one group by using impedance calibration information;

a comparison section configured to compare a reference voltage with an output voltage of the one group and to generate a comparison signal; and a counting section configured to count the impedance calibration information in response to the comparison signal.

* * * * *